(12) United States Patent
Mueller et al.

(10) Patent No.: US 11,735,578 B2
(45) Date of Patent: Aug. 22, 2023

(54) SEMICONDUCTOR QUANTUM DEVICE ESD PROTECTION

(71) Applicant: INTERNATIONAL BUSINESS MACHINES CORPORATION, Armonk, NY (US)

(72) Inventors: Peter Mueller, Zurich (CH); Thomas Morf, Zurich (CH); Mridula Prathapan, Adliswil (CH); Matthias Mergenthaler, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 25 days.

(21) Appl. No.: 17/564,157

(22) Filed: Dec. 28, 2021

(65) Prior Publication Data
US 2023/0207554 A1    Jun. 29, 2023

(51) Int. Cl.
| H01L 27/02 | (2006.01) |
| G06N 10/00 | (2022.01) |
| H01L 29/872 | (2006.01) |
| H02H 9/04 | (2006.01) |

(52) U.S. Cl.
CPC ......... *H01L 27/0251* (2013.01); *G06N 10/00* (2019.01); *H01L 29/872* (2013.01); *H02H 9/046* (2013.01)

(58) Field of Classification Search
CPC ... H01L 27/0251; H01L 29/872; G06N 10/00; H02H 9/046
USPC .......................................................... 361/56
See application file for complete search history.

(56) References Cited

U.S. PATENT DOCUMENTS

| 5,530,612 | A | 6/1996 | Maloney |
| 7,683,364 | B2 | 3/2010 | Edwards et al. |
| 10,373,946 | B2 | 8/2019 | Lee et al. |
| 10,381,340 | B2 | 8/2019 | Lai |
| 10,937,903 | B2 | 3/2021 | Balakrishnan et al. |
| 11,038,346 | B1 | 6/2021 | Delshadpour et al. |
| 11,055,625 | B2 | 7/2021 | Leuven et al. |
| 11,177,654 | B1* | 11/2021 | Jennings ................. H02H 9/046 |
| 2004/0246650 | A1* | 12/2004 | Grigorov ............... H01L 23/552 257/E23.114 |

(Continued)

OTHER PUBLICATIONS

Wang, C. et al., "A Study of Transient Voltage Peaking in Diode-Based ESD Protection Structures in 28nm CMOS"; IEEE Access (2020), vol. 8, pp. 87164-87172.

(Continued)

*Primary Examiner* — Dharti H Patel
(74) *Attorney, Agent, or Firm* — Intelletek Law Group, PLLC; Gabriel Daniel, Esq.

(57) ABSTRACT

An electrostatic discharge (ESD) protection circuit is configured to protect a target circuit that operates in a cryogenic temperature is provided. The ESD protection circuit connects a terminal of the target circuit and a ground potential with no connection to a bias potential. When the ESD protection circuit receives a voltage potential at the terminal of the target circuit, the ESD protection circuit (i) disallows electrical current to flow through from the received voltage potential when the device is at a cryogenic temperature and (ii) allows electrical current to flow through from the received voltage potential when the device is at a room temperature.

20 Claims, 5 Drawing Sheets

(56) References Cited

U.S. PATENT DOCUMENTS

| | | | |
|---|---|---|---|
| 2010/0214704 A1* | 8/2010 | Lamey | H01L 27/0255 257/E21.536 |
| 2013/0207224 A1* | 8/2013 | Park | H01L 27/0248 257/487 |
| 2018/0247925 A1 | 8/2018 | Salman et al. | |
| 2019/0198492 A1 | 6/2019 | Liu et al. | |
| 2019/0252536 A1 | 8/2019 | George et al. | |
| 2021/0036511 A1 | 2/2021 | Chang | |

OTHER PUBLICATIONS

Salman, A. A. et al., "Field Effect Diode (FED): A Novel Device for ESD Protection in Deep Sub-Micron SOI Technologies"; IEEE (2006); 4 pgs.

Zhang, F. et al., "A Full-Chip ESD Protection Circuit Simulation and Fast Dynamic Checking Method Using SPICE and ESD Behavior Models"; IEEE (2018); 10 pgs.

Yeh, C. et al., "Optimization on Layout Style of ESD Protection Diode for Radio-Frequency Front-End and High-Speed I/O Interface Circuits"; IEEE Transactions on Device and Materials Reliability (2010); vol. 10:2; pp. 238-246.

Hong, S. "ESD Design and Analysis by Drain Electrode-Embedded Horizontal Schottky Elements for HV nLDMOSs", Electronics (2021); vol. 10:2, 15 pgs.

Potocnik, A. et al., "Millikelvin Temperature Cryo-CMOS Multiplexer for Scalable Quantum Device Characterisation"; arxiv.org/abs/2011.11514 (2020); 36 pgs.

Teverovsky, A., "Reliability of Electronics at Cryogenic Temperatures", QSS Group, Inc. (2005), Code 562, NASA GSFC, Greenbelt, MD 20771; 22 pgs.

Vinson, J.E. et al., "Electrostatic Discharge in Semiconductor Devices: An Overview"; Proceedings of the IEEE (1998); vol. 86:2; pp. 399-418.

* cited by examiner

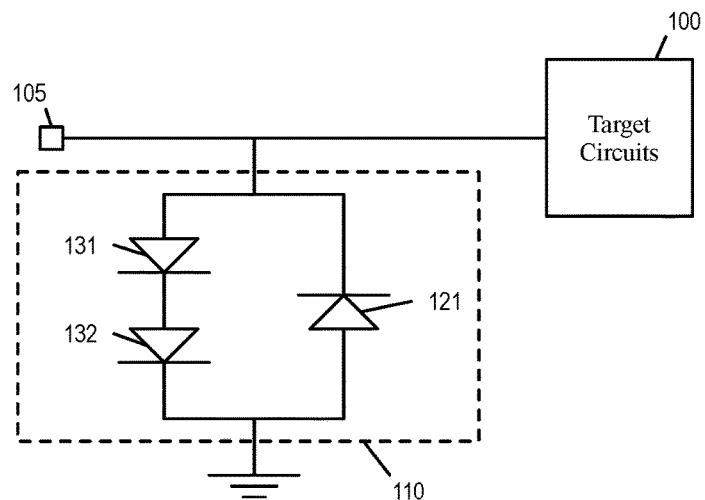
*FIG. 1*
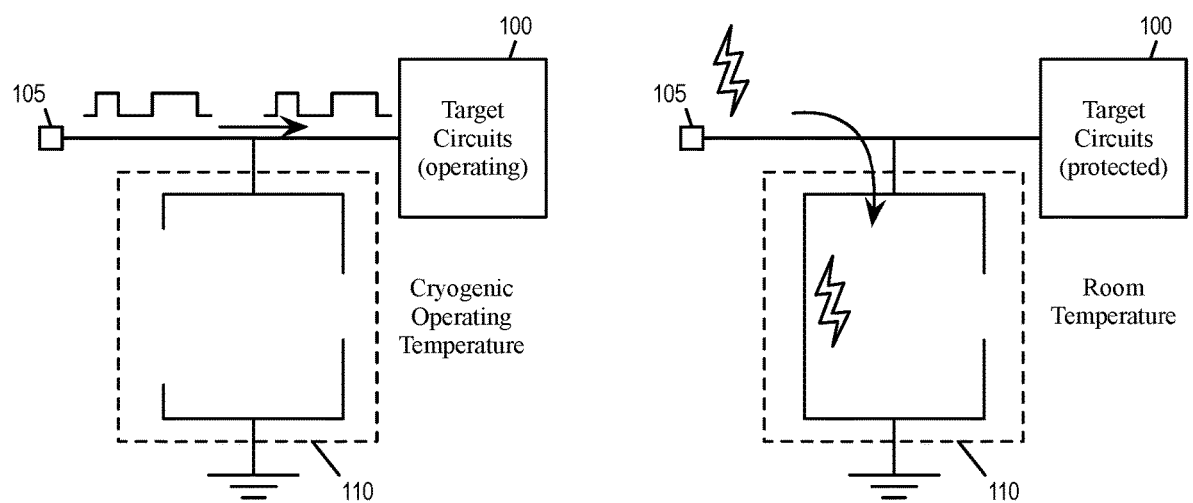
*FIG. 2A*  *FIG. 2B*

SEMICONDUCTOR QUANTUM DEVICE ESD PROTECTION

BACKGROUND

Technical Field

The present disclosure generally relates to protection of circuits against electrostatic discharge (ESD), and more particularly, to protection of semiconductor devices in quantum computing systems.

Description of the Related Arts

Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials. A superconducting device may be constructed to operate as a qubit. Such a device may operate in an extremely low temperature superconducting infrastructure to minimize passive and active heat loads, while guaranteeing rapid qubit control and readout.

Sensitive components need to be protected during and after manufacture, during shipping and device assembly, and in the finished device. Many electronic components, such as integrated circuits (IC) and microchips that support quantum computing, including packaged cryo-electronics and semiconductor-based qubits, are very fragile and can be easily damaged by electrostatic discharge (ESD) during handling. An IC may fail when the electrostatic discharge exceeds a certain voltage, which gives rise to a high peak current. The small interconnecting links and wires, or the devices in the IC itself can be fused or damaged by the amount of heat dissipated.

SUMMARY

Some embodiments provide an electrostatic discharge (ESD) protection circuit for protecting a target circuit in a device that operate in a cryogenic temperature. The ESD protection circuit connects a terminal of the target circuit and a ground potential with no connection to a bias potential. When the ESD protection circuit receives a voltage potential at the terminal of the target circuit, the ESD protection circuit (i) disallows electrical current from the received voltage potential to flow through (by acting as an insulator and becoming invisible to the target circuit) when the device is at a cryogenic temperature and (ii) allows electrical current from the received voltage potential to flow through to the ground (to discharge ESD pulse) when the device is at a room temperature.

The target circuit may implement a qubit for a quantum computing system. The room temperature at which the ESD protection circuit conducts to discharge ESD pulse may be greater than 0° C. The cryogenic temperature at which the ESD protection circuit becomes invisible may be less than 1° K or as high as the boiling temperature of liquid nitrogen at 77° K.

The ESD protection circuit transitions to disallowing electrical current at an operating voltage level of the target circuit when a temperature of the ESD protection circuit falls below a particular transition temperature. In some embodiments, the transition temperature is determined by a geometry and a doping concentration of the ESD protection circuit.

In some embodiments, the ESD protection circuit includes one or more PN junction diodes or Schottky diodes. In some embodiments, the ESD protection circuit includes one or more reverse bias diodes having a forward direction toward the terminal of the target circuit and one or more forward bias diodes having a forward direction toward the ground potential. The reverse bias diode is configured to limit a maximum negative potential and the one or more forward bias diodes are configured to limit a maximum positive potential.

By virtue of the teachings herein, a ESD protection circuit is provided to protect electrical devices that operate in cryogenic temperatures. The ESD protection circuit protects the device from electrostatic discharges that may occur during room temperature handling. The ESD protection becomes invisible in cryogenic temperatures to minimize interference with normal operations of the device.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 1 illustrates an ESD protection circuit being used to protect a target circuit, consistent with an illustrative embodiment.

FIG. 2A illustrates the ESD protection circuit operating in a cryogenic temperature at an operating voltage level of the target circuit, consistent with an illustrative embodiment.

FIG. 2B illustrates the ESD protection circuit operating at room temperature and at an operating voltage level of the target circuit, consistent with an illustrative embodiment.

DETAILED DESCRIPTION

Figure 3:
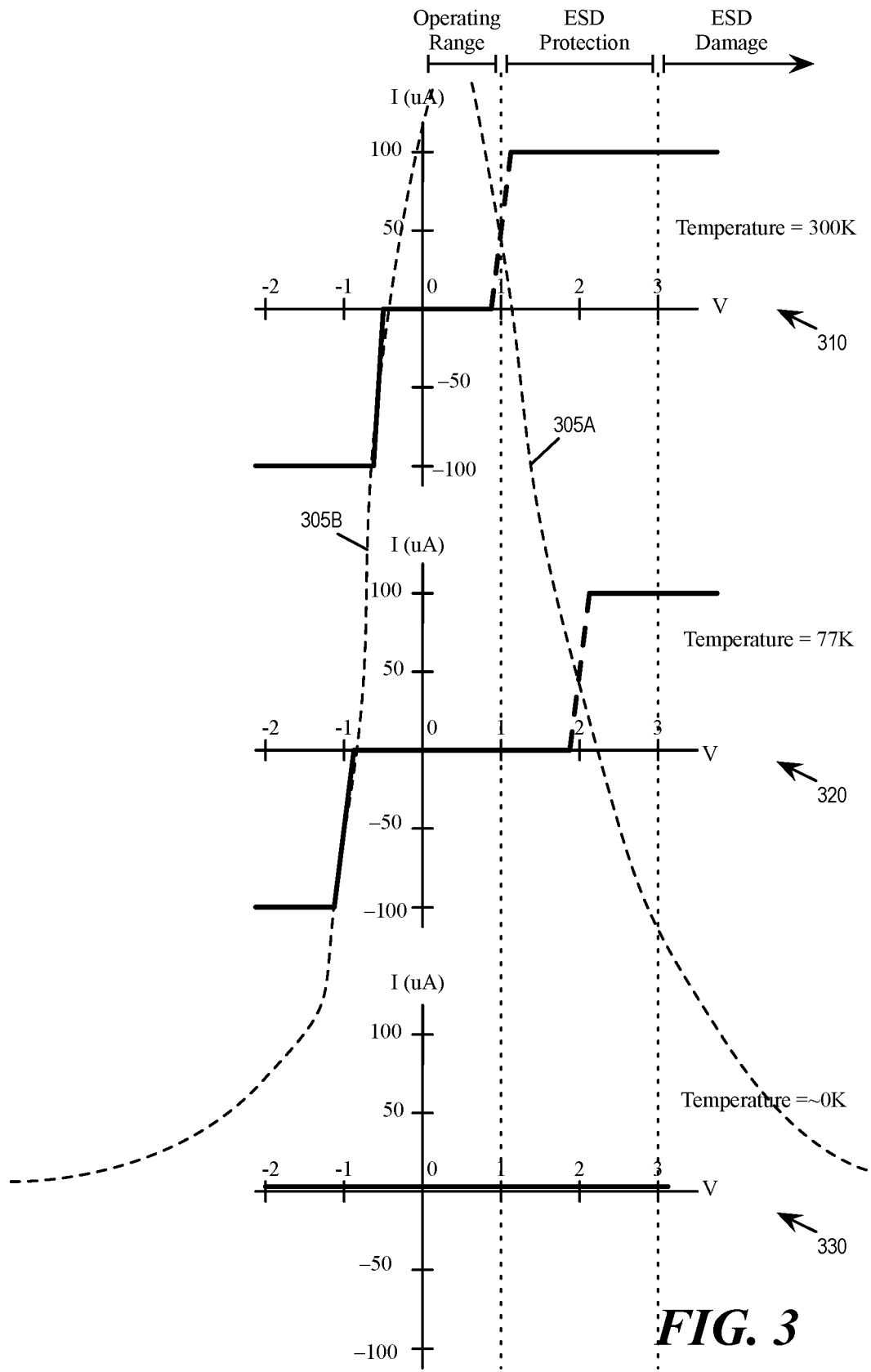
FIG. 3 illustrates the current-voltage relationship of the ESD protection circuit at various temperatures, consistent with an illustrative embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Packaged cryo-electronics and semiconductor-based qubits (and other semiconductor devices within a quantum computing stack) are very fragile and can be easily damaged by electrostatic discharge (ESD) during handling and mounting. A state-of-the-art semiconductor device may not survive a ESD voltage swing due to effects such as gate oxide break down and drain-source snapback. Unfortunately, a common ESD protection circuit may influence the characteristics of the target circuit, which is critical for qubit control and read-out. For example, a diode-based ESD protection circuit may add leakage that affects the performance of the target circuit.

The range between a maximum operating volage level and the ESD damage voltage level of the target circuit defines its ESD window. For example, for MOSFETs and associated qubit technologies, this window is very small (e.g., around 2V, since the operating voltage level is around 1V and the ESD damage voltage level is around 3V.)

Some embodiments provide an ESD protection circuit for target circuits that operate at cryogenic temperatures. The ESD protection circuit can protect spin qubits, semiconductor-superconductor hybrid qubits or other semiconductor-based devices. The ESD protection circuit can protect Cryo-CMOS or Cryo MOSFET devices and modules at temperatures above a specified level (e.g., 20° K). The ESD protection circuit protects the target circuit during handling at room temperature but is invisible during operation at cryogenic temperatures. Below a specific transition temperature, the device has extended signal range with very little or no parasitic noise. This allows quantum read-out and control channels which rely on low signal loss and noise. The temperature at which the ESD protection circuit transitions to high-resistance (and therefore invisibility) can be determined by the ESD protection circuit's geometries and doping concentrations.

The ESD protection circuit includes a connection to system ground and no bias potentials. The ESD protection circuit remains invisible up to a maximal operating voltage level and turns resistive below a ESD damage voltage level. The ESD protection circuit can be implemented at any packaging stage (e.g., in the quantum chip, at the interposer, at the control chip, etc.) In some embodiments, the signal range of the ESD protection circuit is adjustable by the number of forward diodes used.

For some embodiments, FIG. 1 illustrates a ESD protection circuit 110 being used to protect a target circuit 100, consistent with an exemplary embodiment. The target circuit 100 is expected to operate in extremely low or cryogenic temperatures. The target circuit 100 may be a field effect transistor (FET) device, a complementary metal oxide semiconductor (CMOS) circuit/logic, single flux quantum (SFQ) logic, semiconductor spin qubits, semiconductor-superconductor hybrid qubits or devices, etc. The ESD protection circuit 110 may be in a same IC as the target circuit 100. The ESD protection circuit 110 may be in a same packaged device as the target circuit but in a separate IC. The ESD protection circuit 110 may also be installed at an interposer of the packaged device.

The ESD protection circuit 110 has a connection to ground potential and a connection to a terminal 105 of the target circuit, but no connection to a bias potential. The terminal 105 may be an input terminal, an output terminal, or a terminal of supply voltage. The ESD protection circuit 110 includes one reverse bias diode 121 to the ground for limiting a maximum negative potential and two serialized forward bias diodes 131 and 132 to ground to limit a maximum positive potential. In some embodiments, the diodes are p-n junction diodes. In some embodiments, the diodes are Schottky diodes.

FIGS. 2A-B conceptually illustrates the ESD protection circuit 110 operating in different temperatures. FIG. 2A illustrates the ESD protection circuit 110 operating in a cryogenic temperature at an operating voltage level of the target circuit 100. Data signals within an operating voltage range is applied at the terminal 105. The cryogenic temperature is the temperature that the target circuit 100 is expected to be operating in to support qubit operations, which may be less than 77° K, or less than 1° K, or in a range of 5° K to 1 milli ° K. At this temperature and at this voltage level, the ESD protection circuit 110 becomes "invisible" so the electrical current of data signal from the terminal 105 goes only to the target circuit 100. In other words, the ESD protection circuit 110 is disallowing electrical current through itself by acting as an insulator, or allowing only a negligible amount of leakage current. For example, spin qubit devices are operational up to at least 5° K, and the corresponding cryogenic temperature at which the ESD protection circuit becomes invisible may be less than 10° K.

FIG. 2B illustrates the ESD protection circuit 110 operating at a room temperature at an operating voltage level of the target circuit 100. ESD is occurring at the terminal 105 due to handling. The room temperature is the temperature that the target circuit is expected to be handled and therefore likely to have ESD events. The room temperature may be greater than 0° C., for example, near 27° C. or 300° K. At this temperature and at this voltage level, the ESD protection circuit 110 acts as a resistor or a conductor to allow the electrical current from the terminal 105 to go directly to the ground without damaging the target circuit 110.

FIG. 3 illustrates the current-voltage relationship of the ESD protection circuit 110 at different temperatures, consistent with an exemplary embodiment. The ESD protection circuit 110 is used to protect an example target circuit or target device whose operating voltage range is between 0V and 1V. The ESD protection range of the target circuit is between 1V to 3V. The ESD damage voltage level of the target circuit is 3V and above.

The ESD protection circuit is expected to allow voltage potential between 0V to 1V to reach the target device. The ESD protection circuit is expected to draw current away from the target circuit 100 when the voltage potential is between 1V and 3V and when the target circuit 100 is being handled at room temperature where ESD event is likely to occur. For ESD events greater than 3V, the ESD protection circuit 100 still conducts to discharge the ESD, though the ESD may damage the target circuit. (The current level of 100 uA reflect the limitation of the measurement system, not of the diodes in the ESD protection circuit.)

Graphs 310, 320, and 330 show the current-voltage relationship of the ESD protection circuit 110 at three different temperatures. Graph 310 illustrates the current-voltage relationship at 300° K, or typical room temperature in which the target device is handled. At this temperature, the ESD protection circuit disallows current below 1V. In other words, at 300° K, the ESD protection circuit allows current to flow through to protect the target circuit from ESD surge if the input voltage is 1V or greater. The ESD protection circuit 110 also protects the target circuit against negative input voltage by conducting current beyond −0.5V.

Graph 320 shows the current-voltage relationship of the ESD protection circuit 110 at 77° K, which is the boiling temperature of liquid nitrogen. At this temperature, the ESD protection circuit disallows current below 2V, and conducts current above 2V. In other words, at 77° K, the ESD protection circuit is invisible to the target circuit 100 for input voltage up to 2V. The ESD protection circuit 110 also conducts current due to negative input voltage beyond −1V.

Graph 330 shows the current-voltage relationship of the ESD protection circuit 100 at near 0° K (e.g., 5° K to 1milli ° K), which is the temperature at which a qubit circuit is expected to operate. At this temperature, the ESD protection circuit can disallow current regardless of the input voltage, and may be invisible to the target circuit 100. The device can have extended signal range with very little or no parasitic noise. This allows quantum read-out and control channels which rely on low signal loss and low noise.

The figure also shows temperature dependent curves 305A-B that conceptually connect the points of protection at various temperatures. For positive input voltage, the curve 305A runs through 1V at 300° K, 2V at 77° K, and is asymptotic to the voltage axis at 0 ° K. For negative input voltage, the curve 305B runs through −0.5V at 300° K, −1V at 77° K, and is asymptotic to the voltage axis at 0° K. Within the curves 305A-B, the ESD protection circuit 110 act as an open circuit and does not draw current to discharge ESD pulses, thereby becoming invisible to allow the target circuit to operate. Beyond the curves 305A-B, the ESD protection circuit 110 conducts current and discharges ESD pulses to the ground, thereby protecting the target circuit.

The behavior of the ESD protection circuit is determined based on the number of chained diodes, geometries of the diodes, and dopant concentrations of the diodes. For example, at room temperature of 300° K, the two serialized forward bias diodes 131 and 132 cause the ESD protection circuit 110 to act as an open circuit below 1V, thereby allowing the target circuit to have an operating range between 0 and 1V.

Furthermore, the temperature at which the ESD protection circuit 110 transitions to high-resistance (and therefore invisibility) for a given input voltage is determined by the ESD protection circuit's geometries and doping concentrations (or other diode characteristics). In the example of FIG. 3, for input voltage of 2V, this transition temperature is 77° K. A ESD protection circuit having a different geometry and/or doping concentration than the ESD protection circuit 110 may transition to invisibility at 2V at a temperature higher or lower than 77° K.

Figure 4:
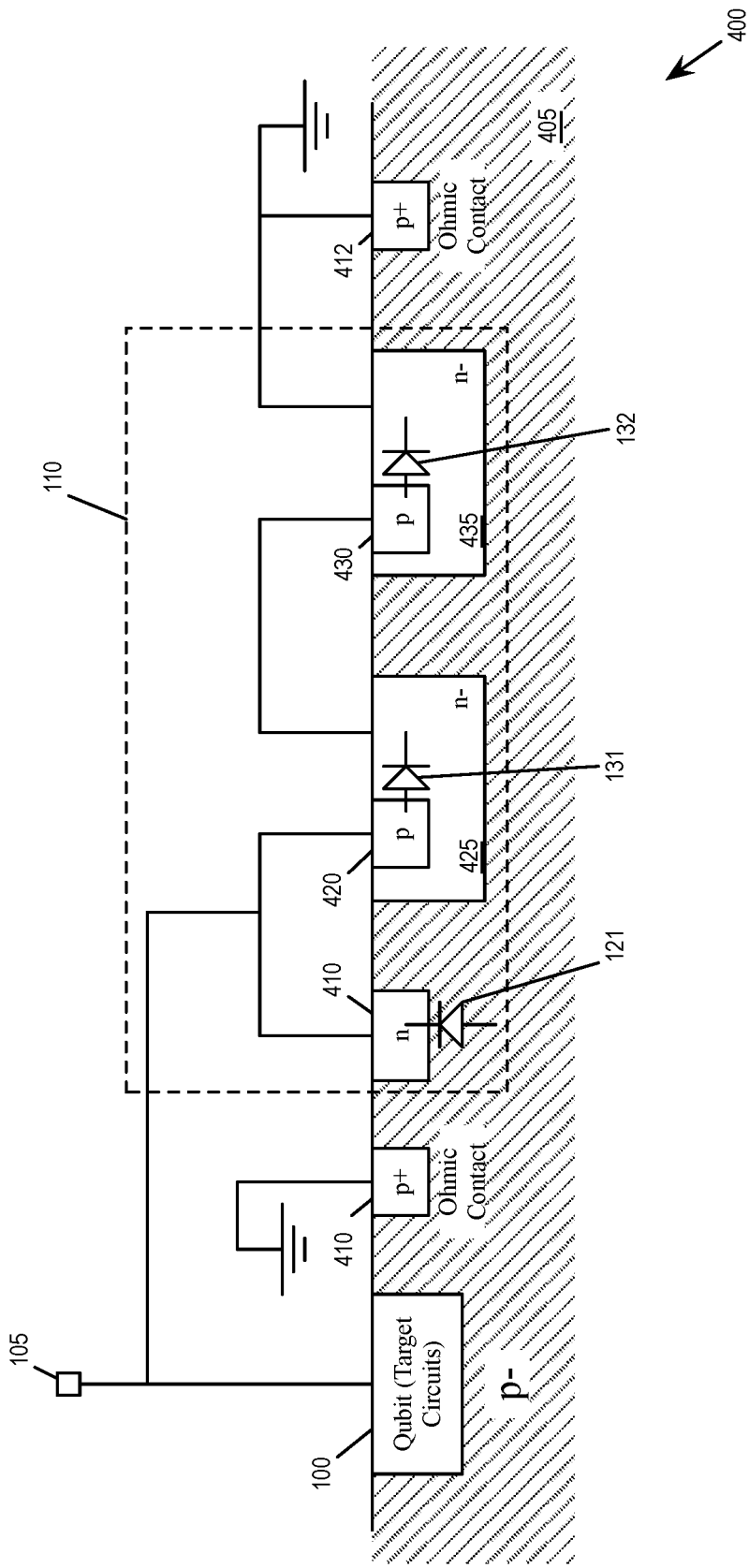
FIG. 4 illustrates an IC that implements the target circuit and the ESD protection circuit, consistent with an illustrative embodiment.

In some embodiments, the ESD protection circuit 110 can be implemented in the same IC as the target circuit. FIG. 4 illustrates an IC 400 that implements the target circuit 100 and the ESD protection circuit 110. In the example of FIG. 4, the IC 400 is built on a p-type substrate 405. The target circuit 100 is built on the substrate 405 (with its various components as doped semiconductors, metallic deposits, insulators, dielectric, etc.). The substrate 405 has ohmic contacts 410 and 412 with the ground. An n-type doped region 410 forms a p-n junction as the reverse diode 121. A first p-type doped region 420 in a first n-type well 425 forms the forward diode 131 and a second p-type doped region 430 in a second n-type well 435 forms the forward diode 132.

In the example of FIG. 4, the ESD protection circuit 110 is implemented in the quantum chip (target device) itself, but the ESD protection circuit 110 can also be implemented elsewhere relative to the target device, such as at the interposer of a chip package or at a control chip of a quantum computing system. In some embodiments, the different terminals of the target circuit may each have its own corresponding ESD protection circuit.

Figure 5:
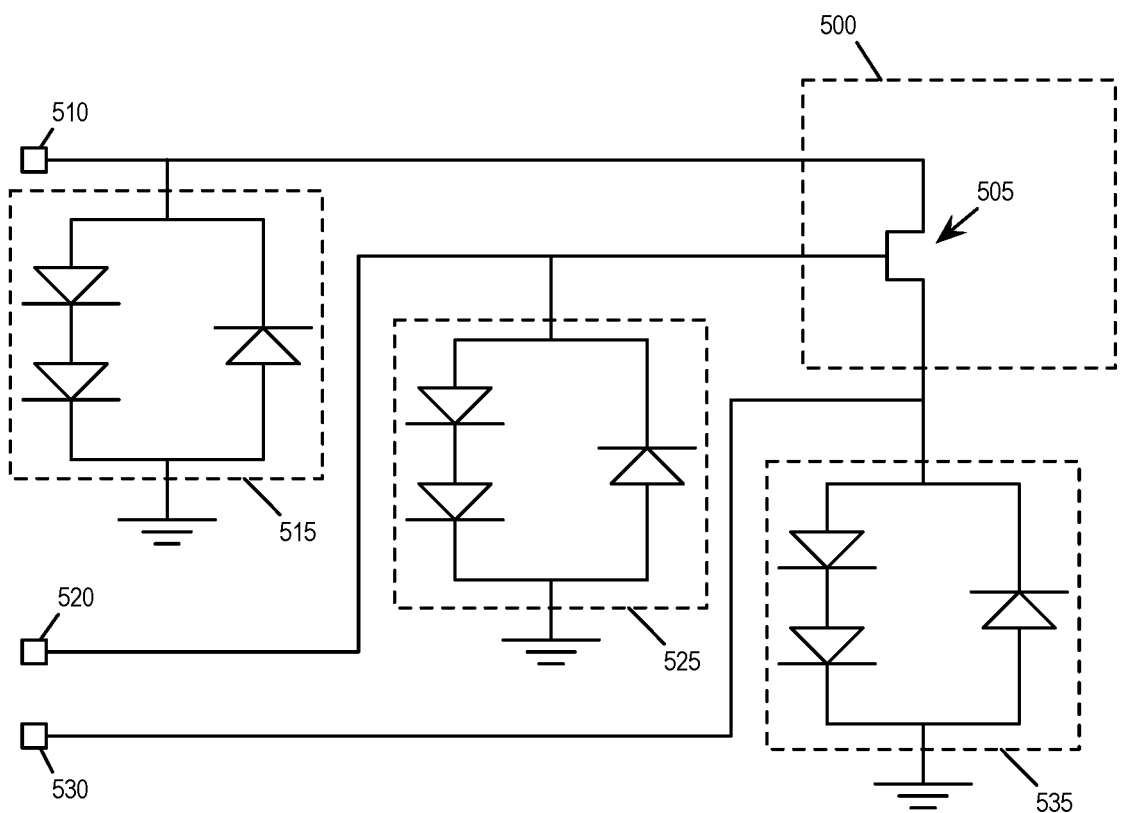
FIG. 5 illustrates a target circuit having multiple terminals that are protected by ESD protection circuits, consistent with an illustrative embodiment.

FIG. 5 illustrates a target circuit 500 having multiple terminals that are protected by ESD protection circuits, consistent with an exemplary embodiment. In the example, the target circuit 500 has three terminals or I/O ports 510, 520, and 530 that are connected to an internal device 505 (e.g., a transistor) of the target circuit. The IO port 510 is protected by a ESD protection circuit 515. The IO port 520 is protected by a ESD protection circuit 525. The 10 port 530 is protected by a ESD protection circuit 535. Each of the ESD protection circuits 515, 525, and 535 has a connection to system ground but no bias potentials.

Figure 6:
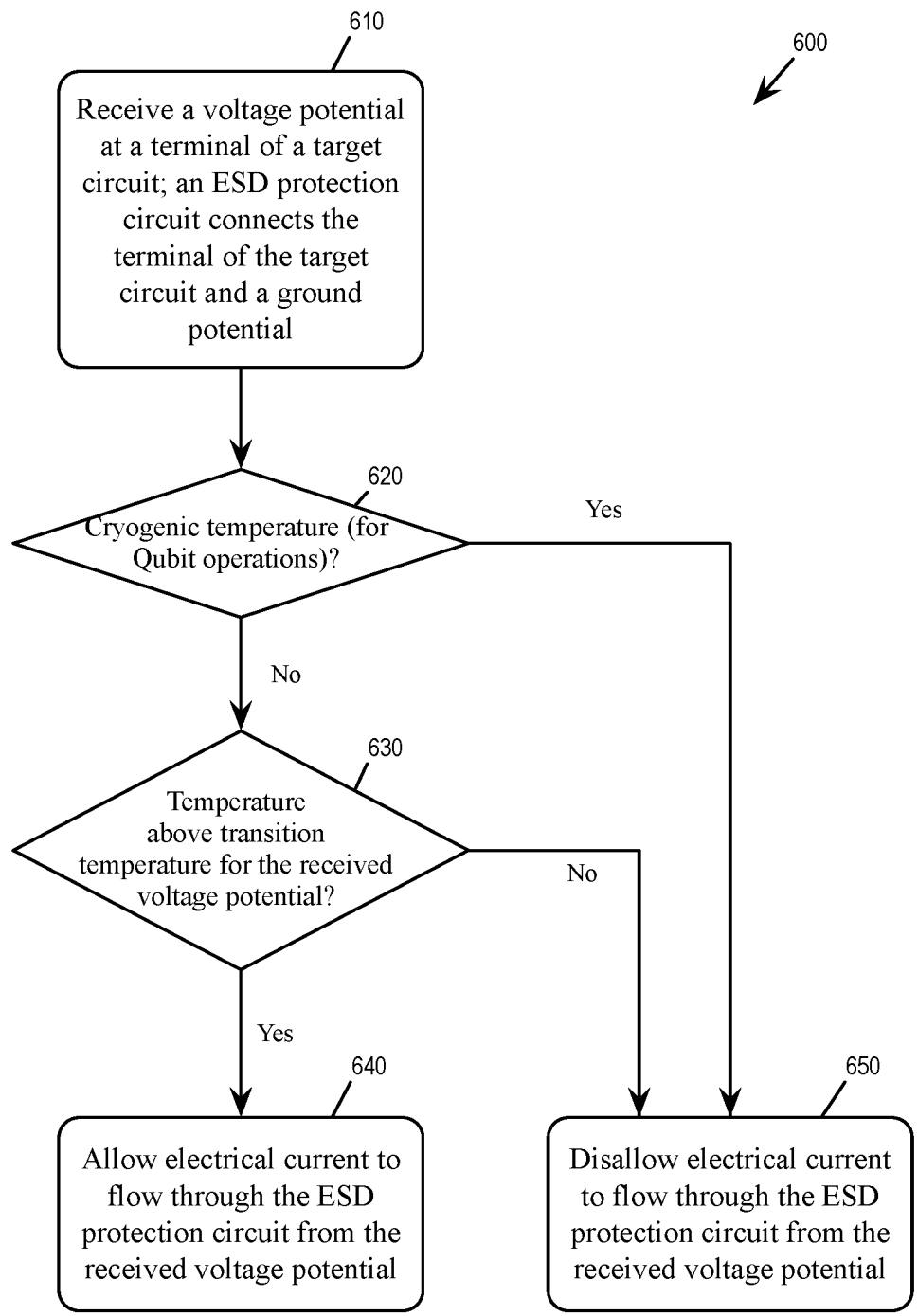
FIG. 6 conceptually illustrates a process for protecting a cryogenic target circuit from ESD, consistent with an illustrative embodiment.

FIG. 6 conceptually illustrates a process 600 for protecting a cryogenic target circuit from ESD, consistent with an illustrative embodiment. The target circuit may implement as a qubit for a quantum computing system. The process 600 describes the behaviors or operations of an ESD protection circuit (e.g., the ESD protection circuit 110). The ESD protection circuit connects a terminal of the target circuit and a ground potential but has no connection to bias potential. The ESD protection circuit may have one or more (e.g., reverse bias) diodes having a forward direction toward the terminal of the target circuit and one or more (e.g., forward bias) diodes having a forward direction toward the ground potential. The reverse bias diode is for limiting a maximum negative potential and the forward bias diodes are for limiting a maximum positive potential.

At block 610, the ESD protection circuit receives a voltage potential at the terminal of the target circuit. At block 620, the process determines whether the temperature of the ESD protection circuit is at a cryogenic temperature (e.g., for qubit operations). In some embodiments, the qubit operating temperature is near 0° K. The behavior of the ESD protection circuit near 0° K is described above by reference to FIG. 3C. If the temperature is at the cryogenic temperature, the process proceeds to block 650. If the temperature is higher than the cryogenic temperature, the process proceeds to block 630.

At block 630, the process determines whether the temperature of the ESD protection circuit is above a transition temperature for the received voltage potential. For example, according to FIG. 3A, for input voltage 1.5V, the temperature 300° K is (or room temperature) is above the transition temperature so the ESD protection circuit will allow current flow. On the other hand, according to FIG. 3B, for input voltage 1.5V, the temperature 77° K is below the transition temperature so the ESD protection circuit will disallow current flow. In some embodiments, the transition temperature is determined by a geometry and a doping concentration of the ESD protection circuit. If the temperature is above the transition temperature, the process proceeds to block 640. If the temperature is below the transition temperature for the received voltage potential, the process proceeds to block 650.

At block 640, the ESD protection circuit allows electrical current to flow through the ESD protection circuit from the received voltage potential.

At block 650, the ESD protection circuit disallows electrical current to flow through the ESD protection circuit from the received voltage potential. In other words, the ESD protection circuit acts as an insulator and is invisible to the target device.

The flowchart in FIG. 6 illustrates the operations of possible implementations of systems, or methods according to various embodiments of the present disclosure. In this regard, each block in the flowchart may represent a module, segment, or portion of instructions for implementing the specified operation(s). In some alternative implementations, the operations noted in the blocks may occur out of the order noted in the FIG. 6. For example, two blocks shown in succession may, in fact, be executed substantially concurrently, or the blocks may sometimes be executed in the reverse order, depending upon the operations involved.

The descriptions of the various embodiments of the present disclosure have been presented for purposes of illustration, but are not intended to be exhaustive or limited to the embodiments disclosed. For example, instead of the two series diodes 131 and 132 in the ESD protection circuit 110, a ESD protection circuit may have one or more diodes in reverse bias based on a power supply rail that is available in a cryo-electronic circuit.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
a target circuit that operates at a cryogenic temperature; and
an electrostatic discharge (ESD) protection circuit connected between a terminal of the target circuit and a ground potential, wherein when the ESD protection circuit is configured to, upon receiving a voltage potential at the terminal of the target circuit:
disallow electrical current to flow through the ESD protection circuit from the received voltage potential when the device is at the cryogenic temperature; and
(ii) allow electrical current to flow through the ESD protection circuit from the received voltage potential when the device is at a room temperature.

2. The device of claim 1, wherein the ESD protection circuit is configured to act as an insulator to disallow the electrical current to flow through the ESD protection circuit and act as a resistor or a conductor to allow the electrical current to flow through the ESD protection circuit.

3. The device of claim 1, wherein the target circuit implements a qubit or a CMOS control device for a quantum computing system.

4. The device of claim 1, wherein the room temperature is greater than 0° C.

5. The device of claim 1, wherein the cryogenic temperature is less than 10° K.

6. The device of claim 1, wherein:
the ESD protection circuit is configured to transition to disallow electrical current at an operating voltage level of the target circuit when a temperature of the ESD protection circuit falls below a particular transition temperature; and
the transition temperature is based on a geometry and a doping concentration of the ESD protection circuit.

7. The device of claim 1, wherein the ESD protection circuit has no connection to a bias voltage.

8. The device of claim 1, wherein:
the ESD protection circuit comprises one or more reverse bias diodes having a forward direction toward the terminal of the target circuit and one or more forward bias diodes having a forward direction toward the ground potential;
the reverse bias diode is configured to limit a maximum negative potential; and
the one or more forward bias diodes are configured to limit a maximum positive potential.

9. The device of claim 1, wherein the ESD protection circuit comprises one or more p-n junction diodes or Schottky diodes.

10. A method for protecting a target circuit in a device, the method comprising:
receiving a voltage potential at a terminal of the target circuit;
connecting the terminal of the target circuit and a ground potential by an electrostatic discharge (ESD) protection circuit;
disallowing electrical current to flow through the ESD protection circuit from the received voltage potential when the device is at a cryogenic temperature; and
allowing electrical current to flow through the ESD protection circuit from the received voltage potential when the device is at a room temperature.

11. The method of claim 10, wherein the ESD protection circuit acts as an insulator to disallow the electrical current to flow through the ESD protection circuit and acts as a resistor or a conductor to allow the electrical current to flow through the ESD protection circuit.

12. The method of claim 10, wherein the target circuit implements a qubit or CMOS control circuitry for a quantum computing system.

13. The method of claim 10, wherein the room temperature is greater than 0° C. and the cryogenic temperature is less than 10° K.

14. The method of claim 10, wherein the ESD protection circuit has no connection to a bias voltage.

15. The method of claim 10, wherein:
the ESD protection circuit transitions to disallowing electrical current at an operating voltage level of the target circuit when a temperature of the ESD protection circuit falls below a particular transition temperature; and
the transition temperature is based on a geometry and a doping concentration of the ESD protection circuit.

16. The method of claim 10, wherein:
the ESD protection circuit comprises one or more reverse bias diodes having a forward direction toward the terminal of the target circuit and one or more forward bias diodes having a forward direction toward the ground potential;
the reverse bias diode limits a maximum negative potential; and
the one or more forward bias diodes limit a maximum positive potential.

17. An integrated circuit (IC) comprising:
a target circuit that operates at a cryogenic temperature; and
an electrostatic discharge (ESD) protection circuit connected between a terminal of the target circuit and a ground potential, wherein when the ESD protection circuit is configured to, upon receiving a voltage potential at the terminal of the target circuit:
(iii) disallow electrical current to flow through the ESD protection circuit from the received voltage potential when the device is at the cryogenic temperature; and
(iv) allow electrical current to flow through the ESD protection circuit from the received voltage potential when the device is at a room temperature.

18. The IC of claim 17, wherein the ESD protection circuit has no connection to bias potential.

19. The IC of claim 17, wherein:
the ESD protection circuit comprises one or more reverse bias diodes having a forward direction toward the terminal of the target circuit and one or more forward bias diodes having a forward direction toward the ground potential;
the reverse bias diode is configured to limit a maximum negative potential; and
the one or more forward bias diodes are configured to limit a maximum positive potential.

20. The IC of claim 17, wherein the ESD protection circuit comprises one or more p-n junction diodes or Schottky diodes.

* * * * *